(12) United States Patent
Ohashi et al.

(10) Patent No.: US 12,518,959 B2
(45) Date of Patent: Jan. 6, 2026

(54) METHOD FOR MANUFACTURING WAFER HAVING FUNCTIONAL FILM

(71) Applicant: Nissan Chemical Corporation, Tokyo (JP)

(72) Inventors: Tomoya Ohashi, Toyama (JP); Suguru Sassa, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 373 days.

(21) Appl. No.: 18/030,549

(22) PCT Filed: Oct. 1, 2021

(86) PCT No.: PCT/JP2021/036523
§ 371 (c)(1),
(2) Date: Apr. 6, 2023

(87) PCT Pub. No.: WO2022/080158
PCT Pub. Date: Apr. 21, 2022

(65) Prior Publication Data
US 2023/0369037 A1 Nov. 16, 2023

(30) Foreign Application Priority Data
Oct. 12, 2020 (JP) ................. 2020-172188

(51) Int. Cl.
*H01L 21/02* (2006.01)
*B05D 1/00* (2006.01)
*B05D 1/40* (2006.01)

(52) U.S. Cl.
CPC ........ *H01L 21/02016* (2013.01); *B05D 1/005* (2013.01); *B05D 1/40* (2013.01); *H01L 21/0209* (2013.01)

(58) Field of Classification Search
CPC .......... H01L 21/02016; H01L 21/0209; B05D 1/005; B05D 1/40
See application file for complete search history.

(56) References Cited

U.S. PATENT DOCUMENTS

| 9,760,007 | B2 | 9/2017 | Kuga |
| 11,183,415 | B2 | 11/2021 | Ogino et al. |
| 2003/0008129 | A1* | 1/2003 | Cotte .................. H01L 21/7682 257/E21.259 |

FOREIGN PATENT DOCUMENTS

| CN | 105993061 A | 10/2016 |
| CN | 109417026 A | 3/2019 |

(Continued)

OTHER PUBLICATIONS

Translation of JP 2006-080298 (Year: 2025).*
(Continued)

*Primary Examiner* — Richard A Booth
(74) *Attorney, Agent, or Firm* — GREENBLUM & BERNSTEIN, P.L.C.

(57) ABSTRACT

A method for manufacturing a wafer having a functional film, with an outer peripheral part of a top face of the wafer annularly exposed, the method including: spin-coating a high-viscosity coating material that contains a functional film constituent over the top face of the wafer to form a coating film; subsequently, supplying a cleaning liquid to the outer peripheral part of the top face of the wafer and kept rotated to remove the coating film on the outer peripheral part of the top face of the wafer; subsequently, heating the coating film on the wafer to form a fluidity suppressed film; subsequently, supplying a cleaning liquid to the outer peripheral part of the top face of the wafer having the fluidity suppressed film and kept rotated to remove the fluidity (Continued)

suppressed film on the top face of the wafer; and subsequently, heating the fluidity suppressed film on the wafer.

8 Claims, 2 Drawing Sheets

(56) References Cited

FOREIGN PATENT DOCUMENTS

| | | | |
|---|---|---|---|
| JP | 04-239721 | A | 8/1992 |
| JP | 2006-080298 | A | 3/2006 |
| JP | 2008-205286 | A | 9/2008 |
| JP | 6472760 | B2 | 2/2019 |
| KR | 10-2019-0019932 | A | 2/2019 |
| WO | 2015/121947 | A1 | 8/2015 |
| WO | 2017/221772 | A1 | 12/2017 |

OTHER PUBLICATIONS

International Search Report and Written Opinion of the International Searching Authority issued in International Pat. Appl. No. PCT/JP2021/036523, dated Dec. 14, 2021, along with an English translation thereof.

Office Action that issued in corresponding Korean Patent Application No. 10-2023-7012858, dated Mar. 18, 2025, along its English translation.

Office Action that issued in Chinese Patent Application No. 202180069636.X, dated May 31, 2024, along with English translation thereof.

Office Action that issued in corresponding Taiwanese Patent Application No. 110137046, dated Sep. 2, 2025, along its English translation.

\* cited by examiner

METHOD FOR MANUFACTURING WAFER HAVING FUNCTIONAL FILM

TECHNICAL FIELD

The present invention relates to a method for manufacturing a wafer having a functional film, with an outer peripheral part of the top face of the wafer annularly exposed.

BACKGROUND ART

Recent semiconductor integration technology under active development has employed three-dimensional integration (stacking) of flat circuit substrates aiming at further integration, in which multiple integration has been enabled by interconnect with use of through-silicon via. Each wafer used for such integration is thinned by grinding, on a face opposite to a face having a circuit formed thereon (that is, the back face). The integration is accomplished by stacking the thinned wafers.

The wafer before being thinned with use of a grinder is usually bonded to a support in a temporary manner, since the wafer needs to be easily detached after the grinding. Such temporary bonding necessarily keeps the wafer easily detachable from the support, since the thinned wafer may be easily damaged if the detachment needs a large force. It is, however, undesirable for the wafer during back grinding to cause detachment or displacement of the substrate, due to grinding stress.

Hence, performance required for the temporary bonding is to withstand the stress during grinding, and to allow easy detachment after the grinding.

Polysiloxane material has been known as a material that enables such temporary bonding (see Patent Literature 1, for example).

By coating such coating material for temporary bonding on the top face of the wafer, obtainable now is a wafer having a coating film. Upon heating of the wafer having the coating film, the coating film demonstrates adhesiveness, and is turned to a functional film having adhesiveness. The wafer having the functional film is thus obtainable.

Now, in the manufacture of a semiconductor element, the functional film formed in an end part (outer peripheral part) of the wafer is desired to be cleaned up from the end part of the wafer. If the functional film were left unremoved in the end part of the wafer, or if the end face of the functional film remained after the removal were poorly profiled, the wafer having the functional film, when used in a step after formation of the functional film, would produce dust ascribed to wear of the end of the functional film, or would pollute a wafer transfer arm.

Hence, there is a demand for a method for manufacturing a wafer having a functional film, with an outer peripheral part of the top face of the wafer annularly exposed, and with an end face of removal of the functional film well profiled.

There is a known method for manufacturing a wafer having a coating film, with the outer peripheral part of the top face of the wafer annularly exposed by removing the coating film having been formed on the outer peripheral part of the top face of the wafer, wherein the coating film is a resist film (see, Patent Literature 2, for example).

CITATION LIST

Patent Literature

Patent Literature 1: WO 2017/221772
Patent Literature 2: WO 2015/121947

SUMMARY OF INVENTION

Technical Problem

Patent Literature 2, which uses a resist film as the coating film, describes that the coating film is removed after heating (drying by baking), by spraying an edge rinse liquid or a back rinse liquid (see claim 1, paragraph [0016], etc.). Patent Literature 2 also describes that the wafer having the coating film, after removal of the coating film on the outer peripheral part of the top face thereof, is transferred to an exposure apparatus for lithographic process (see paragraph [0023]). That is, the description teaches that the removal of the coating film is terminated by a rinsing step, and the process then proceeds to the next step.

In a case where the coating film is a resist film as described in Patent Literature 2, the water with the outer peripheral part of the top face thereof annularly exposed may be manufactured by heating, which is followed by a rinsing step. Patent Literature 2 describes that the wafer having a resist film, which is however removed from the outer peripheral part of the top face of the wafer, may be formed by heating (drying by baking) and subsequent rinsing.

On the other hand, the functional film concerned in the present invention demonstrates functionality upon heating. Hence, any effort to obtain the wafer having the functional film in the present invention requires a heating step for forming the functional film. For example, in a case of using the functional film that contains an aforementioned temporarily bondable material, it will be necessary to coat the coating material for temporary bonding over the top face of the wafer to obtain the wafer having the coating film, and then to heat the coating film, to obtain the wafer having the functional film that demonstrates adhesiveness.

The functional film having adhesiveness, if formed by heating the coating film that contains the coating material for temporary bonding so as to cure the film constituent, is however hardly soluble in a rinsing solution, since the functional film has been cured. Hence, any effort of removing the functional film, after formed, by spraying the rinsing solution will fail in thoroughly removing the functional film.

Accordingly, in order to remove the functional film on the outer peripheral part of the top face of the wafer so as to obtain the wafer having the functional film, with the outer peripheral part of the top face thereof annularly exposed, the rinsing step has to precede the heating for curing the coating film.

Now, the present invention will not direct a method that does not need the heating process after the rinsing step, just like in a case where the resist film is used as the coating film. Rather, the present invention directs a method for manufacturing a wafer essentially in need of a heating process for obtaining the functional film after the rinsing step, whose procedure is specialized to the functional film, differently from that in the method of using the resist film.

In other aspect, the coating material that contains a component that constitutes the functional film often has high viscosity, as described previously regarding the temporarily bondable material. Even with use of such high-viscosity coating material for manufacturing the wafer having the functional film, the wafer having the functional film is desired to be manufactured, in which the functional film on the outer peripheral part of the top face of the wafer is cleanly removed, thus exposing the outer peripheral part of the top face of the wafer in a well-profiled annular shape.

The studies by the present inventor, however, revealed that use of the high-viscosity coating material made it difficult to cleanly remove the functional film on the outer peripheral part of the top face of the wafer, and to leave the functional film well profiled.

The studies also revealed another serious problem that the high-viscosity coating material, when spin coated over the top face of the wafer, will cause back face pollution of the wafer due to splashing of the liquid.

It is therefore an object of the present invention to provide a method for manufacturing an effectively practical wafer having a functional film, with an outer peripheral part of a top face of the wafer annularly exposed, in which the functional film on the outer peripheral part of the top face of the wafer is cleanly removed even if a high-viscosity coating material is used as a coating material that contains a functional film constituent, with an end face of removal of the functional film well profiled, thus making the functional film formed flat, and a beveled part or a back face of the wafer kept free of pollution ascribed to a residue of the coating film.

Solution to Problem

Aiming at solving the aforementioned problems, the present inventor went into extensive studies on a method for manufacturing a wafer having a functional film, with use of a high-viscosity coating material that contains a functional film constituent, and found that it becomes possible to manufacture an effective practical wafer having a functional film, in which a functional film on an outer peripheral part of a top face of the wafer is cleanly removed, and a beveled part or a back face of the wafer kept free of pollution ascribed to a residue of the coating film, by employing heating for suppressing fluidity of the coating film, additionally to the heating for forming the functional film, making these two heating steps essential, and further by employing cleaning (rinsing) steps before and after the first heating step. The finding led the present inventor to arrive at the present invention.

That is, the present invention encompasses the following aspects.

[1] A method for manufacturing a wafer having a functional film, with an outer peripheral part of a top face of the wafer annularly exposed, the method including:
- a step (A) of spin-coating a high-viscosity coating material that contains a functional film constituent over the top face of the wafer to form a coating film;
- a step (B-1), subsequent to the step (A), of supplying a cleaning liquid to the outer peripheral part of the top face of the wafer having the coating film formed thereon and kept rotated, to remove the coating film on the outer peripheral part of the top face of the wafer;
- a step (C), subsequent to the step (B-1), of heating the coating film on the wafer, to form a fluidity suppressed film in which the fluidity of the coating film has been suppressed;
- a step (D-1), subsequent to the step (C), of supplying a cleaning liquid to the outer peripheral part of the top face of the wafer having the fluidity suppressed film formed thereon and kept rotated, to remove the fluidity suppressed film on the top face of the wafer; and
- a step (E), subsequent to the step (D-1), of heating the fluidity suppressed film on the wafer, to demonstrate a function of the functional film constituent, to be served as the functional film.

[2] The method for manufacturing a wafer having a functional film according to [1], wherein the high-viscosity coating material has a viscosity of 1,000 to 15,000 mP·s.

[3] The method for manufacturing a wafer having a functional film according to [1] or [2], wherein the functional film constituent contains a polymer.

[4] The method for manufacturing a wafer having a functional film according to [3], wherein the polymer contains polysiloxane.

[5] The method for manufacturing a wafer having a functional film according to any one of [1] to [4], wherein the step (D-1) of removing the fluidity suppressed film on the top face of the wafer, while kept rotated, further includes:
1) a step (D-1-1) of supplying a cleaning liquid to the outer peripheral part of the top face of the wafer having the fluidity suppressed film formed thereon, to remove the fluidity suppressed film on the top face of the wafer; and
2) a step (D-1-2) of supplying the cleaning liquid to the outer peripheral part of the top face of the wafer having the fluidity suppressed film formed thereon, at a supply point of the cleaning liquid having been shifted from the supply point in the step (D-1-1) outwardly more distant from the center of the wafer, to remove the fluidity suppressed film on the top face of the wafer.

[6] The method for manufacturing a wafer having a functional film according to any one of [1] to [5], further including a step (B-2), subsequent to the step (A) and prior to the step (C), of supplying a cleaning liquid to a back face of the wafer, to clean the back face of the wafer.

[7] The method for manufacturing a wafer having a functional film according to any one of [1] to [6], further including a step (D-2), subsequent to the step (C) and prior to the step (E), of supplying a cleaning liquid to a back face of the wafer, to clean the back face of the wafer.

[8] The method for manufacturing a wafer having a functional film according to any one of [1] to [7], wherein the cleaning liquid is a hydrocarbon-based cleaning liquid.

Advantageous Effects of Invention

According to the present invention, there is provided a method for manufacturing an effectively practical wafer having a functional film, with an outer peripheral part of a top face of the wafer annularly exposed, in which a functional film on an outer peripheral part of the top face of the wafer is cleanly removed even if a high-viscosity coating material is used as a coating material that contains a functional film constituent, with an end face of removal of the functional film well profiled, thus making the functional film formed flat, and a beveled part or a back face of the wafer kept free of pollution ascribed to a residue of the coating film.

DESCRIPTION OF EMBODIMENTS

Figure 1:
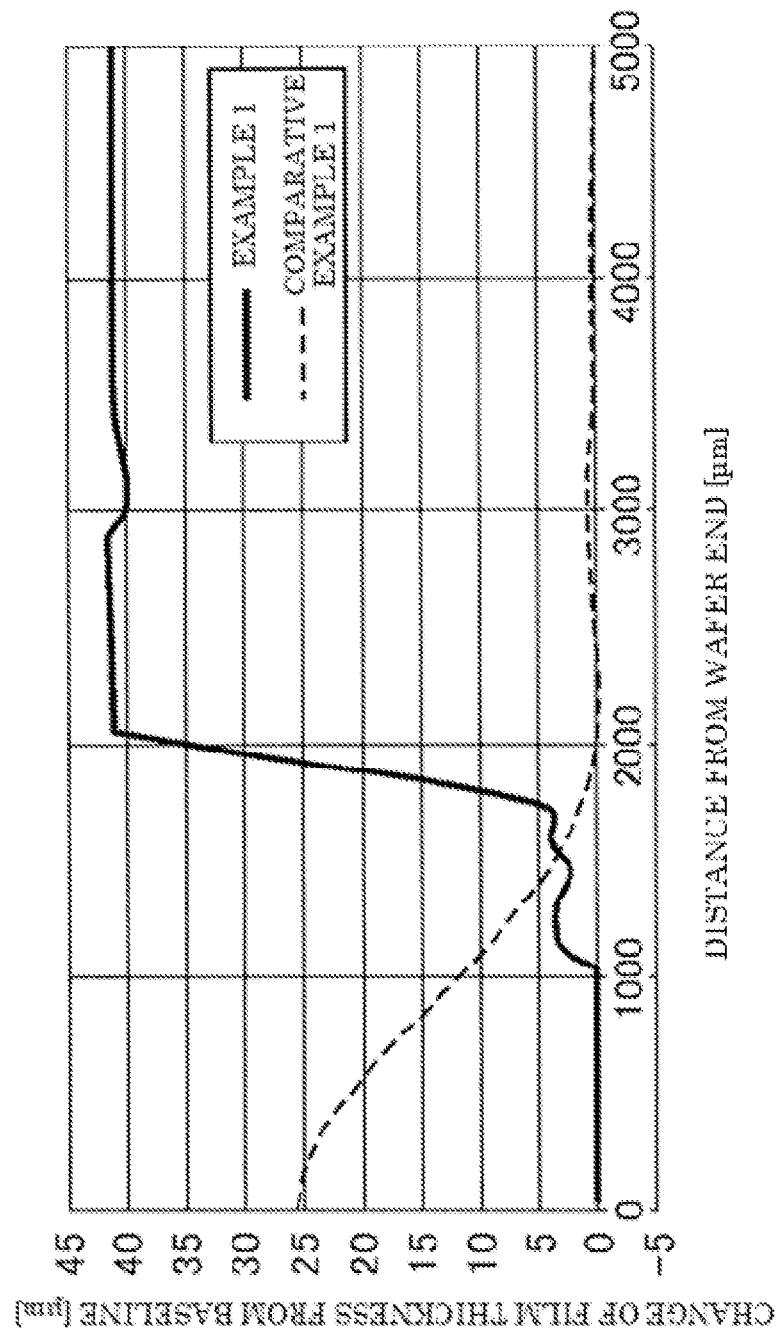
FIG. 1 is a drawing illustrating measurement results of changes in thickness of the functional films at or around the outer peripheral parts of silicon wafers having the functional films in Example 1 and Comparative Example 1.

Hereinafter, a method for manufacturing a wafer having a functional film of the present invention will be detailed. Note that the following description of the constituents merely exemplifies an embodiment of the present invention, to which the present invention is by no means limited.

Method for Manufacturing Wafer Having Functional Film

The method for manufacturing a wafer having a functional film, according to the present invention, relates to manufacture of a wafer having a functional film, with the outer peripheral part of the top face of the wafer annularly exposed.

A method for manufacturing a wafer having a functional film according to the present invention includes:

(I) a step (A) of spin-coating a high-viscosity coating material that contains a functional film constituent over the top face of the wafer to form a coating film;

(II) a step (B-1), subsequent to the step (A), of supplying a cleaning liquid to the outer peripheral part of the top face of the wafer having the coating film formed thereon and kept rotated, to remove the coating film on the outer peripheral part of the top face of the wafer;

(III) a step (C), subsequent to the step (B-1), of heating the coating film on the wafer, to form a fluidity suppressed film in which the fluidity of the coating film has been suppressed;

(IV) a step (D-1), subsequent to the step (C), of supplying a cleaning liquid to the outer peripheral part of the top face of the wafer having the fluidity suppressed film formed thereon and kept rotated, to remove the fluidity suppressed film on the top face of the wafer; and (V) a step (E), subsequent to the step (D-1), of heating the fluidity suppressed film on the wafer, to demonstrate a function of the functional film constituent, to be served as the functional film.

The method for manufacturing a wafer with a functional film according to the present invention, which includes all of the aforementioned steps (I) to (V), can manufacture an effectively practical wafer having a functional film, in which the functional film on the outer peripheral part of the top face of the wafer is cleanly removed, thus exposing the outer peripheral part of the top face of the wafer in a well-profiled annular shape, and a beveled part or the back face of the wafer is kept free of pollution ascribed to a residue of the coating film, as described later in Examples.

All of the aforementioned steps (I) to (V) can cooperatively yield great effects of the present invention. For example, omission of only either step (B-1) of removing the coating film with the cleaning liquid in (II), or the step (D-1) of removing the fluidity suppressed film with the cleaning liquid in (IV), will fail in obtaining a wafer having a functional film, which may be effectively practical as required by the present invention.

Note that the outer peripheral part of the wafer in the present invention means the end part of the wafer. Assuming now a wafer formed in a circle, with the center marked 0, and with the outer circumference marked 100, the outer peripheral part preferably means an annular region that falls in the range from 50 to 100, preferably from 70 to 100, more preferably from 90 to 100, and particularly preferably from 95 to 100.

A preferred mode of the method for manufacturing a wafer having a functional film of the present invention is exemplified by:

(II-1) a method for manufacturing a wafer having a functional film, the method further including a step (B-2), subsequent to the step (A) and prior to the step (C), of supplying a cleaning liquid to the back face of the wafer to clean the back face of the wafer; and (IV-1) a method for manufacturing a wafer having a functional film, the method further including a step (D-2), subsequent to the step (C) and prior to the step (E), of supplying a cleaning liquid to the back face of the wafer to clean the back face of the wafer.

The individual steps will be detailed below.

<(I) Step (A)>

In the step (A), the coating film made of a high-viscosity coating material is formed on the top face of the wafer.

The coating film is formed by spin coating.

The high-viscosity coating material contains a functional film constituent.

The present invention employs spin coating, when coating the coating-type material over the top face of the wafer, from the viewpoint that a uniform film is obtainable with ease and good reproducibility.

The spin coating is a method of supplying a coating material to the top face of a wafer kept rotated, so as to spread the coating material over the entire face of the wafer, assisted by centrifugal force.

<<Wafer>>

The wafer may have any shape without special limitation, which may be circle, or shape other than circle such as polygon. The circle may be true circle, or ellipse. Circle is often used.

The wafer may partially have a cutoff. The cutoff may typically be a notch (groove having U-shape, V-shape, etc.), or a linear part that extends linearly (so-called orientation flat).

The wafer may be any of various substrates such as semiconductor substrate, glass substrate, mask substrate, and flat panel display (FPD) substrate.

The wafer, if in a circular shape, preferably has a diameter of approximately 200 mm to 450 mm. The wafer, if in a shape other than circle, preferably has a size that fits within a circle having a diameter of approximately 200 mm to 450 mm.

The wafer preferably has a thickness of approximately 400 μm to 1200 μm.

The wafer is typically exemplified by semiconductor substrate, which may typically be, but not limited to, silicon wafer having a diameter of approximately 300 mm and a thickness of approximately 770 μm.

<<High-Viscosity Coating Material>>

The high-viscosity coating material contains a functional film constituent.

The high-viscosity coating material may optionally contain a solvent, typically in a case where the material will not have viscosity enough to make it coatable, without containing the solvent.

The functional film constituent is a component that demonstrates a function and becomes able to form the functional film, upon being heated at a predetermined temperature or above. More specifically, this means a component that can cure under heating, and becomes able to form a bondable functional film, just like, for example, the aforementioned temporarily bondable constituent.

The functional film constituent is exemplified by various material components such as conductive material component, insulating material component, adhesive component, and protective material component.

The functional film constituent preferably contains a polymer.

The functional film constituent is specifically exemplified by adhesive composition that contains an adhesive component. This sort of adhesive component is exemplified by, but not limited to, polysiloxane-based adhesive, acrylic resin-based adhesive, epoxy resin-based adhesive, polyamide-based adhesive, polystyrene-based adhesive, polyimide adhesive, and phenol resin-based adhesive.

Among them, thermosetting resin component that contains polysiloxane resin is preferred as the functional film constituent.

The high-viscosity coating material used in the present invention refers to any of those having a viscosity, measured with an E-type viscometer, of 1,000 mPa·s or larger. From the viewpoint of forming the coating film by spin coating, the viscosity of the high-viscosity coating material is preferably 15,000 mPa·s or smaller.

For the convenience of annularly exposing the outer peripheral part of the top face of the wafer, and of forming a highly flat functional film with good reproducibility, the high-viscosity coating material used in the present invention preferably has a viscosity of 1,000 to 12,000 mPa·s, which is more preferably 1,000 to 10,000 mPa·s, and even more preferably 1,500 to 10,000 mPa·s.

The high-viscosity coating material preferably has a concentration of the functional film constituent of, for example, approximately 40 to 100% by mass in the high-viscosity coating material. Now, the functional film constituent refers to a component other than the solvent, contained in the high-viscosity coating material.

Note in some cases where the high-viscosity coating material does not contain the solvent, a certain one of the functional film constituent may demonstrate a function similar to the solvent in the high-viscosity coating material, as well as the function of finally constituting the functional film. In such cases, with such component, or, the component that demonstrates viscosity adjusting ability contained therein, the high-viscosity coating material will have the viscosity fallen within the aforementioned range despite absence of the solvent. In addition, a part of such component will evaporate under heating to reduce the fluidity and to form the fluidity suppressed film, meanwhile the residual part will remain in the film to finally constitute the functional film.

<<Solvent>>

Type of the solvent, when contained in the high-viscosity coating material, is suitably selectable without special limitation, depending on purposes. The solvent, however, preferably does not contain organic solvent whose boiling point is higher than a temperature necessary for curing the functional film constituent. This is because, with the organic solvent whose boiling point higher than a temperature necessary for curing the functional film constituent contained therein, the coating film would fail in reducing the solvent in the coating film, down to a level enough for suppressing the fluidity under heating, although depending on the thickness of the coating film or the amount of consumption of the solvent. For this reason, the content of the organic solvent having a boiling point higher than the temperature necessary for curing the functional film constituent is 50% by mass or less of the solvent contained, the percentage is more preferably 30% by mass or less, even more preferably 20% by mass or less, and yet more preferably 10% by mass or less.

The solvent is appropriately selectable, typically in consideration of the solubility of the functional film constituent, relationship between the boiling point and the temperature required for curing the functional film constituent, and desired film thickness.

The solvent may be used singly, or in combination of two or more kinds thereof.

The solvent to be used, when contained in the high-viscosity coating material is specifically exemplified by: linear or branched aliphatic hydrocarbons sub-categorized as linear or branched aliphatic saturated hydrocarbons that include hexane, heptane, octane, nonane, decane undecane, dodecane and isododecane; alicyclic hydrocarbons sub-categorized as alicyclic saturated hydrocarbons that include cyclohexane, cycloheptane, cyclooctane, isopropylcyclohexane, and p-menthane, and sub-categorized as alicyclic unsaturated hydrocarbon that include limonene; aromatic hydrocarbons such as benzene, toluene, o-xylene, m-xylene, mesitylene, 1,2,4-trimethylbenzene, cumene, 1,4-diisopropylbenzene, and p-cymene; ketones sub-categorized as aliphatic saturated hydrocarbon ketones that include dialkylketones such as methyl isobutyl ketone (MIBK), ethyl methyl ketone, acetone, diisobutyl ketone, 2-octanone, 2-nonanone and 5-nonanone, and include cycloalkyl ketones such as cyclohexanone, and sub-categorized as aliphatic unsaturated hydrocarbon ketones that include alkenylketone such as isophorone; ethers sub-categorized as dialkylethers that include diethyl ether, di(n-propyl) ether, di(n-butyl) ether, and di(n-pentyl) ether, and sub-categorized as cyclic alkyl ethers that include tetrahydrofuran and dioxane; sulfides sub-categorized as dialkyl sulfides that include diethyl sulfide, di(n-propyl) sulfide, and di(n-butyl) sulfide; amides such as N,N-dimethylformamide, N,N-dimethylacetamide, N,N-dimethylisobutyramide, N-methylpyrrolidone, and 1,3-dimethyl-2-imidazolidinone; nitriles such as acetonitrile, and 3-methoxypropionitrile; polyhydric alcohols such as ethylene glycol, diethylene glycol, triethylene glycol, dipropylene glycol, 1,3-butanediol, and 2,3-butanediol; glycol monohydrocarbon ethers sub-categorized as glycol monoalkyl ethers that include propylene glycol monomethyl ether, propylene glycol monoethyl ether, diethylene glycol monomethyl ether, triethylene glycol monomethyl ether, and dipropylene glycol monomethyl ether, and sub-categorized as glycol monoaryl ethers that include diethylene glycol monoaryl ether; alkyl alcohols sub-categorized as linear or branched alkyl monoalcohols that include methanol, ethanol, and propanol, and sub-categorized as cyclic alkyl alcohols that include cyclohexanol; monoalcohols other than alkyl alcohols, such as diacetone alcohol, benzyl alcohol, 2-phenoxyethanol, 2-benzyloxy ethanol, 3-phenoxybenzyl alcohol, and tetrahydrofurfuryl alcohol; glycols such as ethylene glycol, propylene glycol, diethylene glycol, dipropylene glycol, tripropylene glycol, hexylene glycol, triethylene glycol, 1,2-butanediol, 2,3-butanediol, 1,3-butanediol, 1,4-butanediol, and 1,5-pentanediol; glycol monoethers sub-categorized as glycol monoalkyl ethers that include ethylene glycol monohexylether, propylene glycol monobutyl ether, diethylene glycol monoethyl ether, dipropylene glycol monobutyl ether, ethylene glycol monobutyl ether, diethylene glycol monobutyl ether, diethylene glycol monoisobutyl ether, dipropylene glycol monomethyl ether, diethylene glycol monopropyl ether (propylcarbitol), diethylene glycol monohexyl ether, 2-ethylhexylcarbitol, dipropylene glycol monopropyl ether, tripropylene glycol monomethyl ether, diethylene glycol monomethyl ether, and tripropylene glycol monobutyl ether; glycol monoether sub-categorized as glycol monoaryl ether that include 2-phenoxyethanol; glycol diethers sub-categorized as glycol dialkyl ethers that include ethylene glycol dibutyl ether, diethylene glycol dimethyl ether, diethylene glycol diethyl ether, propylene glycol dibutyl ether, dipropylene glycol methyl-n-propyl ether, dipropylene glycol dimethyl ether, dipropylene glycol diethyl ether, dipropylene glycol dibutyl ether, triethylene glycol dimethyl ether, triethylene glycol butylmethyl ether, and tetraethylene glycol dimethyl ether; glycol ether acetates sub-categorized as glycol monoalkyl ether acetates that include dipropylene glycol monomethyl ether acetate, diethylene glycol monoethyl ether acetate, diethylene glycol monobutyl ether acetate, and propylene glycol monomethyl ether acetate; cyclic carbonates such as ethylene carbonate, propylene carbonate, and vinylene carbonate; and esters such as ethyl acetate, butyl acetate, and pentyl acetate.

In the step (A), the high-viscosity coating material is spin coated over the top face of the wafer, to form the coating film.

The coating film herein means a film obtainable by applying the coating material, but not intentionally heated.

The coating film is obtainable by supplying the coating material, to the top face of the wafer kept rotated. More specifically, the coating film may be formed on the top face of the wafer, typically by supplying the high-viscosity coating material through a material supply nozzle arranged above the wafer that is kept rotated.

The thickness of the coating film is adjustable according to the solid concentration or viscosity of the coating material, and the rotational speed of the wafer when rotated.

Any speed commonized in the art is applicable to the rotational speed of the wafer, which is approximately 500 to 4,000 rpm, for example.

The amount of supply of the coating material is properly determined in consideration of the area of the top face of the wafer, so that the coating film may be formed over the entire surface of the wafer.

<(II) Step (B-1)>

In the step (B-1), a part of the coating film formed in the step (A) is removed.

More specifically, a cleaning liquid (rinse liquid) is supplied to the outer peripheral part of the top face the wafer having the coating film formed thereon, while kept rotated, to remove the coating film on the outer peripheral part of the top face of the wafer.

More specifically, the coating film having been formed on the top face of the wafer may be removed, typically by discharging or supplying the cleaning liquid, through a cleaning liquid supply nozzle arranged above the wafer that is kept rotated, thereby dissolving the coating film.

A method of discharging or supplying the cleaning liquid may be an ordinary method known as edge bead removal (EBR), which is designed to clean the coating film on a rim part of the top face of the wafer typically with use of the rinse liquid.

Undergone the step (B-1), the wafer will have improved finish quality of the removal of the fluidity suppressed film on the outer peripheral part on the top face of the wafer, in the step (D-1) described later.

Undergone the step (B-1), the wafer will also be effectively prevented from being polluted on the beveled part or the back face thereof, due to a residue of the coating film.

The beveled part of the wafer means a slope (side face) of the wafer.

<<Cleaning Liquid>>

The cleaning liquid (rinse liquid) is properly selectable without special limitation, as long as it does not damage the wafer, can properly dissolve the coating film, and can remove the coating film. The cleaning liquid may be properly determined in consideration of the type and concentration of the functional film constituent contained in the high-viscosity coating material to be used, and the thickness of the coating film.

Although the cleaning liquid may contain any component other than the solvent such as salt, it is usually preferred that the cleaning liquid is constituted solely by the solvent, typically from the viewpoint of avoiding or suppressing unnecessary pollution of the substrate having the functional film, or denaturation of the functional film.

From the viewpoint of enabling easy drying and removal under heating, the solvent contained in the cleaning liquid preferably does not contain any organic solvent that has a boiling point higher than a temperature necessary for curing the functional film constituent. The solvent is also preferred to be highly volatile and rapid drying.

Specific examples of the solvent, when contained in the cleaning liquid, are same as those specifically exemplified as the aforementioned solvents possibly contained in the high-viscosity coating material.

The solvent may be used singly, or in combination of two or more kinds thereof.

The cleaning liquid usable herein may be any of commercially available ones, which are specifically exemplified by, but not limited to, hydrocarbon-based cleaning liquid (cleaning agent) such as ShellSol MC311 (main component: isoparaffin), MC421 (main component: isoparaffin), MC531 (main component: isoparaffin), MC611 (main component: paraffin), MC721 (main component: normal paraffin), and MC811 (main component: mixture (paraffin/naphthene/aromatic hydrocarbon), all from Tobu Chemical Co., Ltd.

Among them, more preferred hydrocarbon-based cleaning liquid contains aliphatic hydrocarbon, enabling removal of a wide variety of functional film constituents.

A supply point of the cleaning liquid in the step (B-1) is not particularly limited, as long as the coating film on the outer peripheral part of the wafer may be removed, and may be determined for example in a case with a circular wafer, typically in consideration of the width to be finally exposed, film removing power, wettability or spreadability of the cleaning liquid on the wafer. For example, with the center of circle marked 0, and with the outer circumference marked 100, the cleaning liquid is preferably supplied from above the top face of the wafer, within an annular range from 70 to 100.

The cleaning liquid supply nozzle may have any shape properly selectable without special limitation, which is preferably a syringe-type nozzle in view of efficiently dissolve the coating film, through which the cleaning liquid, when discharged onto the wafer, is preferably in the form of straight stream.

Note that the supply point of the cleaning liquid supply nozzle is not always necessarily arranged above the wafer. In an exemplary case where the cleaning liquid is supplied to the wafer which is placed face down, the cleaning liquid supply nozzle may be arranged below the top face of the wafer, and the cleaning liquid may be supplied from below the top face of the wafer.

<(II-1) Step (B-2)>

In the present invention, the method may include the step (B-2) of supplying a cleaning liquid to the back face of the wafer to clean the back face of the wafer, subsequent to the step (A) and prior to the step (C).

When removing the coating film in the aforementioned step (B-1), the step (B-2) may take place concurrently, so as to supply the cleaning liquid not only from the top face side of the wafer, but also from the back face side of the wafer.

More specifically, the cleaning liquid may be discharged and supplied through the cleaning liquid supply nozzle arranged on the back face side of (below) the wafer which is kept rotated.

A method of discharging and supplying the cleaning liquid may be an ordinary method known as back side removal (BSR), which is designed to clean the back face of the wafer typically with use of the rinse liquid.

Undergone the step (B-1) and the step (B-2), the high-viscosity coating material, even if came around the back face of the wafer and adhered there, may be removed so as to keep the back face clean. Hence, any other object, whose surface came into contact with the back face of the wafer, may be prevented from being polluted due to the contact.

When supplying the cleaning liquid to the back face of the wafer, the supply area may be the entire area or a partial area of the back face of the wafer. When supplying the cleaning liquid to a partial area of the back face of the wafer which is circular for example, the cleaning liquid may be supplied to the outer peripheral part thereof, or to the aforementioned annular region.

Undergone the step (B-1) and the step (B-2), the beveled portion and the back face of the wafer may be more effectively prevented from being polluted due to a residue of the coating film, so that the present invention more preferably employs the step (B-2) in addition to the step (B-1).

<(III) Step (C)>

In the step (C), the coating film on the wafer is heated to form a fluidity suppressed film, in which the fluidity of the coating film has been suppressed.

In the present invention, the step (C), which is a heating step for suppressing the fluidity of the coating film, is necessary, besides the heating process in the step (E) for forming the functional film. With the two heating processes in the step (C) and in the step (E) included therein, the present invention can obtain a practically effective wafer having the functional film.

The heating in the step (C) is directed to make the coating film no longer demonstrate fluidity. For example, when heating the coating film with high fluidity in the step (C), obtainable is the fluidity suppressed film whose fluidity has been lost.

The fluidity suppressed film refers to a film obtained by intentionally heating the coating film, which is a film whose fluidity was reduced or lost after heating, as compared with the coating film before being heated.

The fluidity suppressed film, whose fluidity has been lost, is specifically exemplified by a dry film. With the coating material that contains the solvent, obtainable is a dry film having a part of or all of the solvent in the coating film has evaporated (or a solid film solidified after evaporation of the solvent in the coating film), as a result of heating in the step (C).

The fluidity suppressed film obtained in the step (C) usually has a viscosity of approximately 30,000 to 1,000,000 mPa·s when measured with a rheometer under a temperature condition of 25° C. From the viewpoint of obtaining the wafer having the functional film, with the outer peripheral part of the top face of the wafer exposed in a well-profiled annular shape in a highly reproducible manner, the lower limit value is preferably 40,000 mPa·s, and more preferably 50,000 mPa·s, meanwhile the upper limit value is 800,000 mPa·s in a certain mode, and 500,000 mPa·s in other mode.

In a case where the high-viscosity coating material is coated on the wafer, the coating film will not lose the fluidity only by spinning, and will stay as it is, due to high viscosity of the coating film. In particular, the solvent, when contained in the high-viscosity coating material, will not be fully dried off only by spinning, thus leaving the coating film as it is without losing the fluidity. Any effort for removing such high-fluidity coating film on the wafer with use of the cleaning liquid will fail in cleanly remove the coating film, since the centrifugal force of the rotating wafer drives a new coating film to be supplemented from the inner side, as soon as the coating film on the edge is removed.

In contrast, undergone the heating in the step (C) to form the fluidity suppressed film whose fluidity has been lost (for example, a dry film or solid film), there will no longer be an event that the centrifugal force of the rotating wafer drives a new coating film to be supplemented from the inner side, as soon as the coating film on the edge is removed. Hence, the cleaning of the edge with the cleaning liquid can cleanly remove the fluidity suppressed film on the outer peripheral part of the top face of the wafer, making it possible to leave the fluidity suppressed film whose end face is well-profiled.

Note that the fluidity suppressed film obtainable in the step (C) is still on the way to demonstrate the function of the functional film constituent, since the functional film constituent is not yet cured. The functional film constituent, which is not yet fully cured, demonstrates a sufficient level solubility in the cleaning liquid.

The heating temperature in the step (C) can vary typically depending on the temperature necessary for curing the functional film constituent contained in the high-viscosity coating material, or on the film thickness, and therefore cannot be determined unconditionally, but may be approximately lower than 150° C., and preferably lower than 130° C. The heating time can vary depending on the heating temperature, and again cannot therefore be determined unconditionally, but may be approximately 10 seconds to 10 minutes.

The heating may typically employ an oven or a hot plate.

<(IV) Step (D-1)>

In the step (D-1), a part of the fluidity suppressed film obtained in the step (C) is removed.

More specifically, the cleaning liquid (rinse liquid) is supplied to the outer peripheral part of the top face of the wafer having the fluidity suppressed film formed thereon, while kept rotated, to remove the fluidity suppressed film on the outer peripheral part of the top face of the wafer.

More specifically, the fluidity suppressed film having been formed on the top face of the wafer may be removed, typically by discharging and supplying the cleaning liquid, through a cleaning liquid supply nozzle arranged above the wafer that is kept rotated.

The method of discharging and supplying the cleaning liquid may rely upon an ordinary method known as EBR, as described previously in section <(II) Step (B-1)>.

Since the step (D-1) is targeted at the fluidity suppressed film (for example, dry film or solid film) whose fluidity has been lost in the step (C), so as to remove the end part thereof by the cleaning liquid, so that the fluidity suppressed film on the outer peripheral part of the top face of the wafer may be cleanly removed, while leaving the fluidity suppressed film well profiled at the end face.

The cleaning liquid used in the step (D-1) may be same as, or different from the cleaning liquid used in the step (B-1).

From the viewpoint of convenience of the process conditions, both cleaning liquids are preferably the same.

A preferred mode of the step (D-1) of removing the fluidity suppressed film on the top face of the wafer is exemplified by implementation of the step (D-1-1) in 1) below, and the step (D-1-2) in 2) below.

That is, the step (D-1) is more preferably implemented by, while rotating the wafer:

1) a step (D-1-1) of supplying a cleaning liquid to the outer peripheral part of the top face of the wafer having the fluidity suppressed film formed thereon, to remove the fluidity suppressed film on the top face of the wafer; and
2) a step (D-1-2) of supplying the cleaning liquid to the outer peripheral part of the top face of the wafer having the fluidity suppressed film formed thereon, at a supply point of the cleaning liquid having been shifted from the supply point in the step (D-1-1) outwardly more distant from the center of the wafer, to remove the fluidity suppressed film on the top face of the wafer.

The step (D-1), implemented by shifting the supply point of the cleaning liquid, so as to supply the cleaning liquid at different supply points for removal of the fluidity suppressed film, is more preferred from the viewpoint of more cleanly removing the fluidity suppressed film on the outer peripheral part of the top face of the wafer.

Such effort of shifting the supply point of the cleaning liquid in the step (D-1-2) to a point outwardly than in the step (D-1-1), and of supplying the cleaning liquid again to the fluidity suppressed film for removal, is typically intended to reliably eliminate any leakage of the fluidity suppressed film, which possibly swells in contact with the cleaning liquid in the step (D-1-1), and bleeds out.

Therefore, undergone the step (D-1-1) and the step (D-1-2), the fluidity suppressed film on the outer peripheral part of the top face of the wafer may be cleanly removed more reliably, so as to leave the fluidity suppressed film with the end face well profiled.

Although having described that the supply point of the cleaning liquid was shifted so as to supply the cleaning liquid from two different supply points in the aforementioned step (D-1-1) and the step (D-1-2), the number of different supply points is not limited to two, instead allowing provision of three or more supply points, or typically allowing provision of additional steps (D-1-3), (D-1-4) and so on.

<(IV-1) Step (D-2)>

In the present invention, the method may include the step (D-2) of supplying the cleaning liquid to the back face of the wafer to clean the back face of the wafer, subsequent to the step (C) and prior to the step (E).

When removing the fluidity suppressed film in the aforementioned step (D-1), the step (D-2) may take place concurrently, so as to supply the cleaning liquid not only from the top face side of the wafer, but also from the back face side of the wafer.

More specifically, the cleaning liquid may be discharged and supplied through the cleaning liquid supply nozzle arranged on the back face side of (below) the wafer which is kept rotated.

The method of discharging and supplying the cleaning liquid may rely upon an ordinary method known as back side removal (BSR), as described previously in section <(II-1) Step (B-2)>.

Undergone the step (D-1) and the step (D-2), the high-viscosity coating material, even if came around the back face of the wafer and adhered there, may be removed so as to keep the back face clean, even in a case where the step (B-2) was not employed, or the adhered material could not be fully removed despite the step (B-2). Hence, any other object, whose surface came into contact with the back face of the wafer, may be prevented from being polluted due to the contact, and the finally obtainable wafer having the functional film will be prevented from causing nonconformity due to unnecessary adhesion of the material on the back face.

When supplying the cleaning liquid to the back face of the wafer, the supply area may be the entire area or a partial area of the back face of the wafer. When supplying the cleaning liquid to a partial area of the back face of the wafer which is circular for example, the cleaning liquid may be supplied to the outer peripheral part thereof, or to the aforementioned annular region.

Undergone the step (D-1) and the step (D-2), the beveled portion and the back face of the wafer may be more effectively prevented from being polluted due to a residue of the fluidity suppressed film, so that the present invention more preferably employs the step (D-2) in addition to the step (D-1).

<(V) Step (E)>

In the step (E), the fluidity suppressed film on the wafer is heated to demonstrate a function of the functional film constituent, to obtain the functional film.

For example, the functional film constituent is cured to form the functional film. For example, in a typical case where the functional film is an adhesive film, the constituent that has an adhesive component is cured to demonstrate the adhesive function, thereby obtaining the functional film (adhesive film).

The functional film is a film obtainable by intentionally heating the fluidity suppressed film, in which the function of the functional film constituent is demonstrated as a result of heating.

For example, the functional film is such as a film whose functional film constituent is sufficiently cured by heating, thus making the film not fully soluble to the cleaning liquid.

The heating temperature in the step (E) can vary typically depending on the temperature necessary for curing the functional film constituent contained in the high-viscosity coating material, or on the film thickness, and therefore cannot be determined unconditionally, but may be approximately 150° C. or higher, and preferably 180° C. or higher. The heating time can vary depending on the heating temperature, and again cannot therefore be determined unconditionally, but may be approximately 1 minute to 30 minutes.

The heating may typically employ an oven or a hot plate.

An exemplary functional film relevant to the present invention is assumed to have a thickness of 10 µm or larger after heated in the step (E), which is relatively thick for a film formed on the top face of a semiconductor wafer.

The thickness of the functional film is preferably 20 µm or larger, more preferably 30 µm or larger, and even more preferably 40 µm. On the other hand, in consideration of practical convenience, the film thickness of the functional film is 500 µm or smaller, preferably 300 µm or smaller, more preferably 200 µm or smaller, even more preferably 100 µm or smaller, and particularly preferably 70 µm or smaller.

Undergone the step (E), obtainable is an effectively practical wafer having the functional film, in which the functional film on the outer peripheral part of the top face of the wafer is cleanly removed, thus exposing the outer peripheral part of the top face of the wafer in a well-profiled annular shape, with the end face of removal of the functional film well profiled, and the beveled part or the back face of the wafer is kept free of pollution ascribed to a residue of the coating film.

In an exemplary case where the wafer has a circular shape, the present invention can manufacture the wafer having the functional film, in which the outer peripheral part of the top face thereof is annularly exposed (in a ring pattern). Assuming now the center of the circle is marked 0, and the outer circumference is marked 100, the exposed region formed at this time may be an annular region that normally falls in the range from 50 to 100, in a certain mode from 70 to 100, in another mode from 90 to 100, and in still another mode from 95 to 100.

The viscosity of the functional film obtained in the step (E) measured with a rheometer under the heating temperature condition of the step usually exceeds 1,000,000 mPa·s. In a case where the wafer having the functional film obtained by the manufacturing method of the present invention is bonded to a substrate while placing the functional film in between, the viscosity is preferably 2,000,000 mPa·s or larger, more preferably 4,000,000 mPa·s or larger, even more preferably 6,000,000 mPa·s or larger, and yet more preferably 8,000,000 mPa·s or larger, from the viewpoint of suppressing deformation of the functional film, or displacement of the wafer or the substrate. In another case where the wafer and the support substrate are bonded so as to place the functional film in between to form a stack, and the wafer is thinned by grinding while rotating the stack, the viscosity is preferably 10,000,000 mPa·s or larger, more preferably 20,000,000 mPa·s or larger, even more preferably 40,000,000 mPa·s or larger, yet more preferably 80,000,000 mPa·s or larger, and furthermore preferably 100,000,000 mPa·s or larger, from the viewpoint of preventing displacement of the wafer.

The viscosity of the functional film measured with a rheometer under the heating temperature condition in the step (E) is obtainable typically by placing an appropriate amount of the dry film into a 65 mm diameter metal cup, then placing a 25 mm diameter metal plate on the top to prepare a measurement sample, setting the measurement sample on a twin drive rheometer MCR 302 from Anton Paar GmbH, and elevating the temperature at a rate of 5° C./min.

By the way, in an exemplary case where the functional film according to the present invention serves as an adhesive film for temporary adhesion, the functional film is used for bonding a device wafer having a circuit formed thereon and a support wafer (support substrate) as the support, for the convenience of thinning of the wafer as described previously. If necessary, the device wafer and the support wafer are bonded via the functional film together with other film, and the device wafer is ground while being supported on the side of the support wafer.

In an exemplary mode of using the wafer having the functional film according to the present invention, the wafer having the fluidity suppressed film formed thereon, obtained in the step (D-1) and/or the step (D-1) and the step (D-2), is opposed with the support wafer as the support, while placing the fluidity suppressed film in between, and the wafers kept in this state are then heated in the step (E) to form the functional film, thereby bonding the device wafer and the support wafer. The wafers in this process may optionally be pressurized in the vertical direction.

Since the device wafer to be bonded to the support wafer is finished as the wafer having the functional film, in which the functional film on the outer peripheral part of the top face of the wafer is cleanly removed, thus exposing the outer peripheral part of the top face of the wafer in a well-profiled annular shape, so that any subsequent working step, such as grinding of the device wafer, may be implemented properly, without fear of dust generation ascribed to wear of the end of the functional film, or pollution of a wafer transfer arm.

Hence, according to the method for manufacturing the wafer having the functional film of the present invention, any post-process for the semiconductor wafer that has a circuit substrate on which an electronic circuit has been formed on the top face thereof, may be implemented properly, without causing a problem having possibly occurred in a case where the film formed on the wafer that has the circuit substrate has not been cleanly removed from an outer peripheral part of the wafer.

EXAMPLES

The present invention will be further detailed below referring to Examples below, to which the present invention is by no means limited.

Apparatuses used in Examples are as follows.
(1) Coating apparatus: Litho Spin Cup 200C, from Lithotec Japan Corporation
(2) Film thickness analysis: interferrometric film thickness analyzer F50, from Filmetrics, Inc.
(3) Observation of film change (film geometry): stylus profiling system DektakXT-A, from Bruker
(4) Measurement of film viscosity (dry film viscosity): Twin Drive Rheometer MCR 302, from Anton Paar GmbH
(5) Viscometry of coating material (coating composition): E-type viscometers TVE-22H and TVE-35H, from Toki Sangyo Co., Ltd.

Example 1

A coating composition was prepared. The coating composition contains a thermosetting resin component that contains a polysiloxane resin, also contains p-menthane and n-decane as the solvents, and has a viscosity of 2,500 mPa·s which is a value measured with use of an E-type viscometer.

The coating composition was spin-coated (800 rpm, 30 seconds) over the surface of an 8-inch silicon wafer, to form a coating film.

With the silicon wafer having the coating film kept rotated (800 rpm, 10 seconds), a hydrocarbon-based cleaning liquid (ShellSol MC421, from Tobu Chemical Co., Ltd., the same applies hereinafter) was continuously ejected as a straight stream through a syringe-type nozzle, onto the outer peripheral part of the top face, and onto the outer peripheral part of the back face of the wafer, to remove the coating film on the outer peripheral part of the top face of the wafer, and to clean up the outer peripheral part of the back face.

The silicon wafer having the coating film was then spin dried under rotation (800 rpm, 30 seconds), and heated at 120° C. for 90 seconds, to obtain a silicon wafer having a fluidity suppressed film (also referred to as a silicon wafer having a dry film).

With the silicon wafer having the dry film kept rotated (800 rpm, 60 seconds), the hydrocarbon-based cleaning liquid was continuously ejected as a straight stream through a syringe-type nozzle, onto the outer peripheral part of the top face, and onto the outer peripheral part of the back face of the wafer, to remove the dry film on the outer peripheral part of the top face of the wafer, and to clean up the outer peripheral part of the back face. With the silicon wafer still kept rotated, the ejection of the cleaning liquid is temporarily suspended, and the cleaning liquid discharge nozzle through which the cleaning liquid had been ejected onto the top face of the wafer was shifted 1.5 mm outwards. With the silicon wafer having the dry film kept rotated (800 rpm, 60 seconds), the cleaning was resumed, during which the hydrocarbon-based cleaning liquid was continuously ejected as a straight stream through a syringe-type nozzle, onto the outer peripheral part of the top face, and onto the outer peripheral part of the back face of the wafer, so as to remove the dry film on the outer peripheral part of the top face of the wafer, and to clean up the outer peripheral part of the back face.

The silicon wafer having the dry film was then spin dried under rotation (1500 rpm, 30 seconds), and heated at 200° C. for 10 minutes, to obtain the silicon wafer having the functional film.

Comparative Example 1

The procedures from the preparation of the coating composition up to the heating at 120° C. for 90 seconds in Example 1 were implemented similarly, to obtain a silicon wafer having a dry film. The silicon wafer having the dry film was then heated at 200° C. for 10 minutes, to obtain the silicon wafer having the functional film.
(Evaluation of Film Thickness on Silicon Wafer Having Functional Film)

The silicon wafers having the functional films, obtained in Example 1 and Comparative Example 1, were subjected to measurement of film thicknesses, conducted at 17 points on each silicon wafer having the functional film. Average film thickness, and difference between the maximum film thickness and the minimum film thickness are summarized in Table 1. The results teach that the two functional films obtained in Example 1 and Comparative Example 1 were found to have equivalent film thicknesses.

The silicon wafer having the functional film of Example 1 was found to have a flat functional film formed thereon, as can be seen in Table 1 below.

TABLE 1

|  | Average film thickness [μm] | Maximum film thickness – Minimum film thickness [μm] |
|---|---|---|
| Example 1 | 42.71 | 1.07 |
| Comparative example 1 | 43.31 | 2.36 |

(Evaluation of Profile of Functional Film on Outer Peripheral Part of Silicon Wafer Having Functional Film, and Back Face of Wafer)

Changes in the film thickness of the functional film from the vicinity of the outer peripheral part towards the center was observed for each of the silicon wafers having the functional films obtained in Example 1 and Comparative Example 1. Results are summarized in FIG. 1.

As can been seen in FIG. 1, Example 1 demonstrated almost no change in the thickness of the functional film, up to a range approximately 2 mm away from the start point of measurement on the wafer edge, followed by a sharp increase of approximately 40 μm of the film thickness. This indicates that the functional film is not formed, or, the silicon wafer is exposed, up to a range approximately 2 mm away from the start point of measurement. This also indicates that the functional film having an expected thickness (approximately 40 μm) was formed over a region ranged from the 2-mm point towards the center.

In contrast, Comparative Example 1 demonstrated no change in the film thickness which corresponds to the expected film thickness (approximately 40 μm) as observed in Example 1, instead demonstrated an approximately 25 μm decrease up to a range approximately 2 mm away from the start point of measurement on the wafer edge, followed by substantially no change in the thickness.

Judged from such equivalence of the thickness of the functional films between Example 1 and Comparative Example 1, the results indicate that the thickness of the functional film in Comparative Example 1, on the outer peripheral part of the wafer, was larger than the expected thickness (approximately 40 μm).

The silicon wafer having the functional film of Example 1 was found to have the functional film whose end face of removal was well-profiled, and was cleanly removed on the outer peripheral part of the top face of the wafer.

The silicon wafer having the functional film of Example 1, under visual observation, was also found to be free of pollution typically due to material adhesion, on the back face thereof.

The silicon wafer having the functional film of Example 1 was therefore proved to be excellent, without being polluted on the back face.

Reference Example 1

A dry film was scraped off from the silicon wafer having the dry film obtained in Example 1, the dry film was placed in a 65 mm diameter metal cup, and a 25 mm diameter metal plate was placed on the top, to prepare a measurement sample. The measurement sample was set on a twin drive rheometer MCR 302, from Anton Paar GmbH, and the viscosity of the dry film was measured under the condition of a temperature elevation rate of 5° C. per minute.

Figure 2:
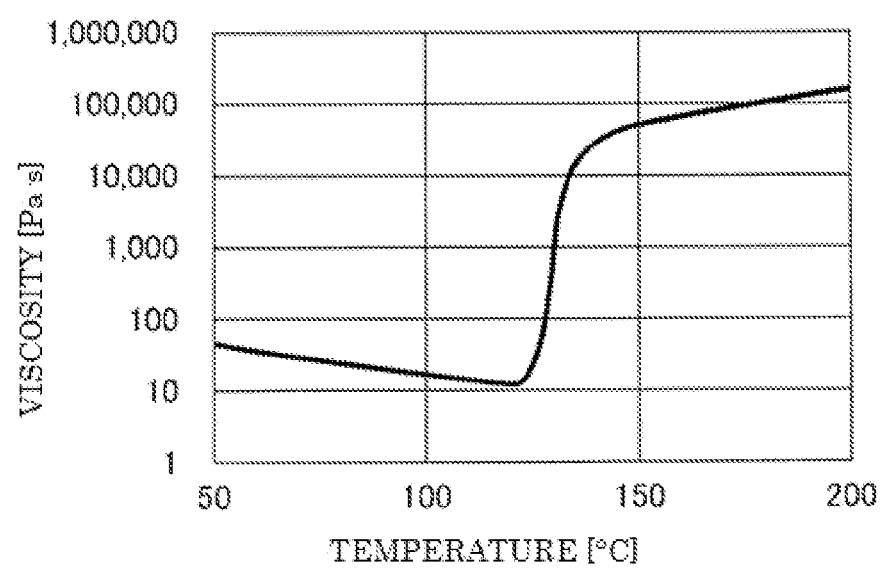
FIG. 2 is a drawing illustrating a change in viscosity with temperature of a dry film obtained in Reference Example 1.

The viscosity change of the dry film, with respect to temperature is shown in FIG. 2. As can be seen in FIG. 2, the viscosity of the dry film sharply increased at or above 120° C.

Note that the heating of the dry film like in the present measurement presumably involves decrease in the viscosity attributable to an event (A) that relates to softening of a polymer that constitutes the dry film under heating; and increase in the viscosity attributable to an event (B) that relates to crosslinking of the polymer that constitutes the dry film under heating. On the other hand, the heating of the coating film, at a temperature lower than the aforementioned temperature where the crosslinking occurs, presumably involves decrease in the viscosity attributable to an event (A); and increase in the viscosity attributable to an event (C) that relates to evaporation of the solvent under heating. As can be understood from the above, the viscosity of the dry film, in the region below 120° C. in the measurement result of the viscosity of the dry film in FIG. 2, is governed by the decrease ascribable to the event (A), thus making the viscosity at 120° C. smaller than that in the temperature range below 120° C. Meanwhile, in the actual heating of the coating film, the viscosity is governed by the increase ascribable to the event (C), thus making the viscosity at 120° C. larger than that in the temperature range below 120° C.

Now, in an exemplary case where the functional film according to the present invention serves as an adhesive film for temporary adhesion, the functional film is typically used for bonding a device wafer having a circuit formed thereon, with a support wafer that serves as the support, for the convenience of thinning of the wafer. The device wafer and the support wafer are bonded while placing the functional film in between, and the device wafer is ground while being supported on the side of the support wafer. Now, the functional film, if having smaller viscosity, would cause displacement of the device wafer during grinding, thus failing to demonstrate the function. Hence, the heating at or above 150° C. is usually necessary to demonstrate the function. On the contrary, the functional film, if having larger viscosity, would make the film unable to be removed by dissolution by the cleaning liquid, due to progress of crosslinking.

Due to the characteristics of the functional film according to the present invention illustrated in FIG. 2, it may be understood that the manufacture of the wafer having the functional film, with the outer peripheral part of the top face of the wafer annularly exposed, requires a first heating step (corresponded to the aforementioned step (C)) for producing a dry film which is soluble to the cleaning liquid; and a second heating step (corresponded to the aforementioned step (E)) for producing the functional film.

Next paragraphs will explain that a high-quality wafer having the functional film, without pollution on the beveled part or on the back face of the wafer, is obtainable by implementing the step (B-1) and the step (B-2), between the step (A) and the step (C), referring to comparison between Reference Example 2 below, and Comparative Reference Example 1 below.

Reference Example 2

A coating composition was prepared. The coating composition contains a thermosetting resin component that contains a polysiloxane resin, also contains p-menthane and n-decane as the solvents, and has a viscosity of 2,500 mPa·s which is a value measured with use of an E-type viscometer.

The coating composition was spin-coated (1050 rpm, 20 seconds) over the surface of a 12-inch silicon wafer, to form a coating film.

With the silicon wafer having the coating film kept rotated (700 rpm, 60 seconds), n-decane was continuously ejected as a straight stream through a syringe-type nozzle, onto the outer peripheral part of the top face, and onto the outer peripheral part of the back face of the wafer, to remove the coating film on the outer peripheral part of the top face of the wafer, and to clean up the outer peripheral part of the back face.

The silicon wafer having the coating film was then spin dried under rotation (700 rpm, 60 seconds), and heated at 120° C. for 90 seconds, to obtain a silicon wafer having the dry film.

The silicon wafer having the dry film was then heated at 200° C. for 10 minutes, to obtain the silicon wafer having the functional film.

Comparative Reference Example 1

The procedures from the preparation of the coating composition, the spin coating (1050 rpm, 20 seconds), up to the formation of the coating film in Reference Example 2 were implemented similarly, to obtain a silicon wafer having a coating film.

The silicon wafer having the coating film was then spin dried, and heated at 120° C. for 90 seconds, to obtain a silicon wafer having the dry film.

The silicon wafer having the dry film was then heated at 200° C. for 10 minutes, to obtain the silicon wafer having the functional film.

(Evaluation of Beveled Part (Side Face) and Back Face of Silicon Wafer Having Functional Film)

The outer peripheral parts (including the side face), and the back faces of the individual silicon wafers having the functional films, obtained in Reference Example 2 and Comparative Reference Example 1, were visually observed. The silicon wafer having the functional film of Comparative Reference Example 1 was found to have white deposit produced over a region ranging from the outer peripheral part of the wafer to the side face of the wafer. The white deposit is undesirable, since it would pollute a transport arm of an apparatus or a hot plate in the manufacturing steps of the dry film.

In contrast, the silicon wafer having the functional film of Reference Example 2 was not found to have such white deposit on the side face and the back face of the wafer.

Hence, in order to manufacture the wafer having the functional film, which is practically effective, free of pollution on the outer peripheral part or the back face thereof due to residue of the coating film, and is capable of preventing pollution of the apparatuses, it is necessary to implement the step (B-1) of cleaning the outer peripheral part of the top face of the wafer, preferably in combination with the step (B-2) of cleaning the back face of the wafer, between the step (A) of forming the coating film by spin coating, and the step (C) of heating to form the dry film.

Reference Example 3

A coating composition was prepared. The coating composition contains a thermosetting resin component that contains a polysiloxane resin, also contains p-menthane and n-decane as the solvents, and has a viscosity of 3,000 mPa·s which is a value measured with use of an E-type viscometer.

The coating composition was spin-coated (1050 rpm, 20 seconds) over the surface of a 12-inch silicon wafer, to form a coating film.

With the silicon wafer having the coating film kept rotated (700 rpm, 60 seconds), n-decane was continuously ejected as a straight stream, onto the outer peripheral part of the top face, and onto the outer peripheral part of the back face of the wafer, to remove the coating film on the outer peripheral part of the top face of the wafer, and to clean up the outer peripheral part of the back face.

The silicon wafer having the coating film was then spin dried under rotation (700 rpm, 60 seconds), and heated at 120° C. for 90 seconds, to obtain a silicon wafer having the dry film.

The dry film was scraped off from the thus obtained silicon wafer having the dry film, the dry film was placed in a 65 mm diameter metal cup, and a 25 mm diameter metal plate was placed on the top, to prepare a measurement sample. The measurement sample was set on a twin drive rheometer MCR 302 from Anton Paar GmbH, and the viscosity of the dry film was measured at a condition of 25° C.

Reference Example 4

A coating composition was prepared. The coating composition contains a thermosetting resin component that contains a polysiloxane resin, also contains p-menthane and n-decane as the solvents, and has a viscosity of 3,000 mPa·s which is a value measured with use of an E-type viscometer.

This coating composition was placed in a 65 mm diameter metal cup, and a 25 mm diameter metal plate was placed on the top, to prepare a measurement sample. The measurement sample was set on a twin drive rheometer MCR 302 from Anton Paar GmbH, and the viscosity of the coating composition was measured at a condition of 25° C.

(Evaluation of Viscosity of Dry Film and Coating Composition)

The viscosities measured at 25° C. with the rheometer in Reference Example 3 and Reference Example 4 are summarized in Table 2 below.

The results teach that the first heating step for producing the dry film could largely improve the viscosity, and could suppress the fluidity of the coating film. With the fluidity of the coating film thus suppressed, there will no longer be an event that the centrifugal force of the rotating wafer drives a new coating film to be supplemented from the inner side, as soon as the coating film on the edge is removed. Hence, the cleaning of the edge with the cleaning liquid can cleanly remove the fluidity suppressed film on the outer peripheral part of the top face of the wafer, making it possible to leave the fluidity suppressed film whose end face is well-profiled.

Considering now influence of drying due to spin coating, the fluidity of the coating film is not same as the fluidity of the coating composition. The fluidity of the coating film is, however, considered to be high enough to allow the film to come around the side face and the back face of the wafer, judged from that the silicon wafer having the functional film in Comparative Example 1 was not cleaned up in the outer peripheral part, and also from the results of Reference Example 2 and Comparative Reference Example 1. In contrast, the dry film on the wafer having the functional film of Example 1 was considered to have fully suppressed fluidity, judged from that the silicon wafer having the functional film was cleaned up in the outer peripheral part. It was also presumed that the viscosity change during formation of the coating film from the coating composition, is more distinctive than the increase in the viscosity during formation of the dry film under heating. From this experiment, it can therefore be confirmed that the fluidity of the film may be sufficiently suppressed by the first heating step.

TABLE 2

|  | Viscosity [mPa · s] |
|---|---|
| Reference example 3 | 91,000 |
| Reference example 4 | 3,500 |

As is clear from Examples above, the method for manufacturing the wafer having the functional film according to the present invention can manufacture an effectively practical wafer having a functional film, in which the functional film on the outer peripheral part of the top face of the wafer is cleanly removed, thus exposing the outer peripheral part of the top face of the wafer in a well-profiled annular shape, and the beveled part or the back face of the wafer is kept free of pollution ascribed to the residue of the coating film.

The invention claimed is:

1. A method for manufacturing a wafer having a functional film, with an outer peripheral part of a top face of the wafer annularly exposed, the method comprising:
   spin-coating a high-viscosity coating material that contains a functional film constituent that can cure when heated over the top face of the wafer to form a coating film;
   subsequent to the formation of the coating film, supplying a first cleaning liquid to the outer peripheral part of the top face of the wafer having the coating film formed thereon and kept rotated, to remove the coating film on the outer peripheral part of the top face of the wafer;
   subsequent to the supplying of the first cleaning liquid to remove the coating film on the outer peripheral part of the top face of the wafer, heating the coating film on the wafer at a temperature lower than the temperature required for hardening the functional film constituent components, to form a fluidity suppressed film in which the fluidity of the coating film has been suppressed;
   subsequent to the formation of the fluidity suppressed film, supplying a second cleaning liquid to the outer peripheral part of the top face of the wafer having the fluidity suppressed film formed thereon and kept rotated, to remove the fluidity suppressed film on the top face of the wafer; and
   subsequent to the removing of the fluidity suppressed film on the top face of the wafer, heating the fluidity suppressed film on the wafer at a temperature equal to or higher than that required for hardening the functional film constituent components, to demonstrate a function of the functional film constituent by curing, to be served as the functional film.

2. The method for manufacturing a wafer having a functional film according to claim 1, wherein the high-viscosity coating material has a viscosity of 1,000 to 15,000 mP·s.

3. The method for manufacturing a wafer having a functional film according to claim 1, wherein the functional film constituent contains a polymer.

4. The method for manufacturing a wafer having a functional film according to claim 3, wherein the polymer contains polysiloxane.

5. The method for manufacturing a wafer having a functional film according to claim 1, wherein the removing of the fluidity suppressed film on the top face of the wafer, while kept rotated, further comprises:
   a first application of the second cleaning liquid by supplying the second cleaning liquid from a first supply point to the outer peripheral part of the top face of the wafer having the fluidity suppressed film formed thereon, to remove the fluidity suppressed film on the top face of the wafer; and
   a second application of the second cleaning liquid by supplying the second cleaning liquid from a second supply point to the outer peripheral part of the top face of the wafer having the fluidity suppressed film formed thereon, where the second supply point is shifted from the first supply point in that the second supply point is positioned outwardly more distant from the center of the wafer than the first supply point, to remove the fluidity suppressed film on the top face of the wafer.

6. The method for manufacturing a wafer having a functional film according to claim 1, further comprising, subsequent to the formation of the coating film and prior to the supplying of the first cleaning liquid, supplying a third cleaning liquid to a back face of the wafer, to clean the back face of the wafer.

7. The method for manufacturing a wafer having a functional film according to claim 1, further comprising, subsequent to the formation of the fluidity suppressed film and prior to the heating of the fluidity suppressed film on the wafer, supplying a fourth cleaning liquid to a back face of the wafer, to clean the back face of the wafer.

8. The method for manufacturing a wafer having a functional film according to claim 1, wherein both the first cleaning liquid and the second cleaning liquid are a hydrocarbon-based cleaning liquid.

\* \* \* \* \*